United States Patent [19]
Kimura et al.

[11] Patent Number: 5,818,788
[45] Date of Patent: Oct. 6, 1998

[54] CIRCUIT TECHNIQUE FOR LOGIC INTEGRATED DRAM WITH SIMD ARCHITECTURE AND A METHOD FOR CONTROLLING LOW-POWER, HIGH-SPEED AND HIGHLY RELIABLE OPERATION

[75] Inventors: Tohru Kimura, Kanagawa, Japan; Charles G. Sodini, Cambridge, Mass.

[73] Assignees: NEC Corporation, Kanagawa, Japan; Massachusetts Institute of Technology, Cambridge, Mass.

[21] Appl. No.: 865,968

[22] Filed: May 30, 1997

[51] Int. Cl.$^6$ .................................................... G11C 7/00
[52] U.S. Cl. ........................................ 365/230.03; 365/233
[58] Field of Search ................................. 365/230.03, 52, 365/233

[56] References Cited

U.S. PATENT DOCUMENTS 5,528,549  6/1996  Doddington et al. .............. 365/230.03
5,689,677 11/1997  MacMillan ........................ 395/433

Primary Examiner—Vu A. Le
Attorney, Agent, or Firm—Sughrue, Mion, Zinn, Macpeak & Seas, PLLC

[57] ABSTRACT

In a logic integrated DRAM LSI with SIMD architecture, a intentional clock skew is introduced for both between DRAM blocks and between logic blocks due to reduce the magnitude of peak current, operation frequency and number of I/O are defined for both DRAM blocks (frequency $f_M$, I/O number m) and logic blocks (frequency $f_N$, I/O number n) to keep the relation of $$f_M \times m = f_N \times n,$$

address out of order scheme is introduced to achieve a high-speed and low-power DRAM access.

11 Claims, 9 Drawing Sheets

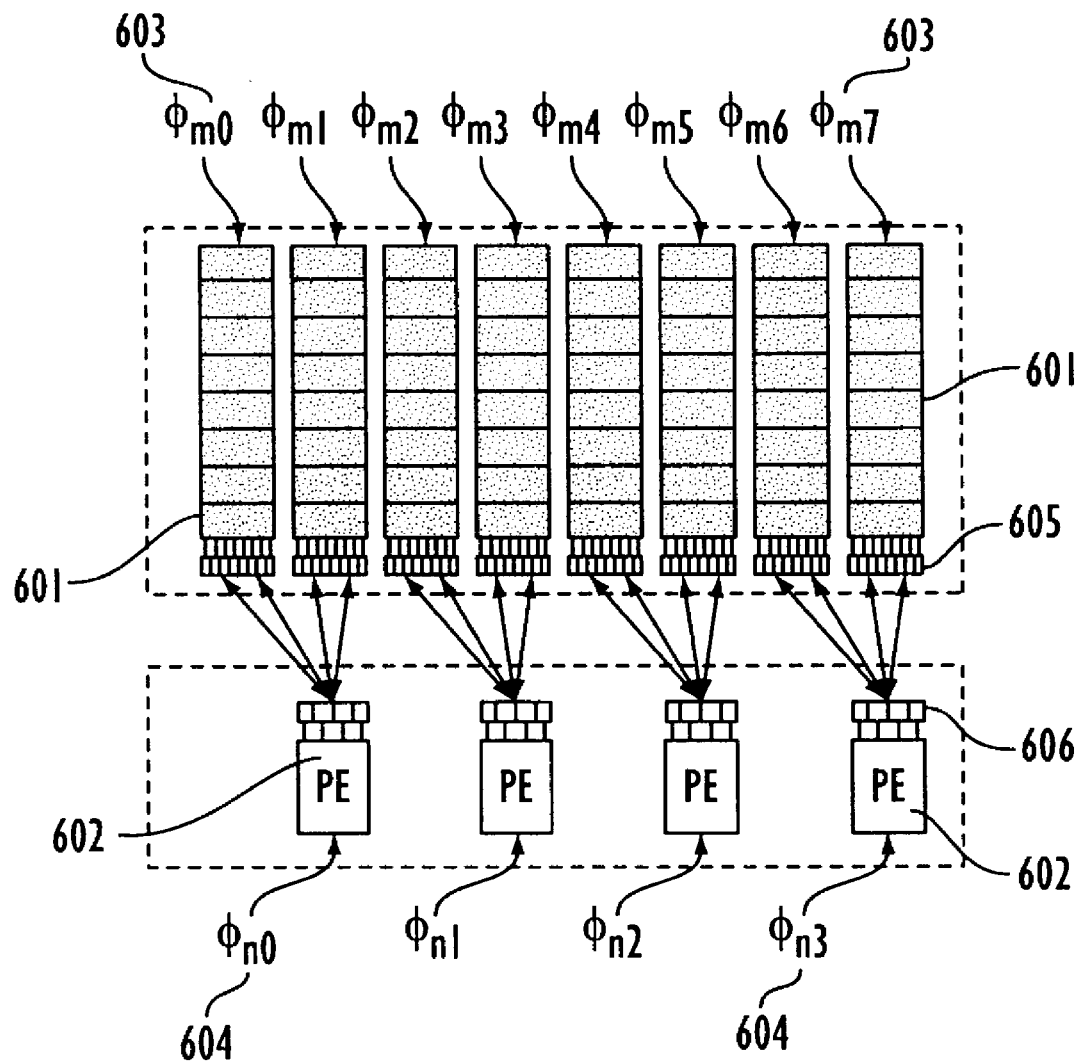

CIRCUIT TECHNIQUE FOR LOGIC INTEGRATED DRAM WITH SIMD ARCHITECTURE AND A METHOD FOR CONTROLLING LOW-POWER, HIGH-SPEED AND HIGHLY RELIABLE OPERATION

BACKGROUND OF THE INVENTION

1. Field of the Invention

The present invention relates to semiconductor LSIs, consisting of large capacity DRAMs and a large number of logic circuits with SIMD architecture, and a method for their low-power, high-speed and highly reliable operation.

2. Description of Related Art

Recently, semiconductor processing techniques have permitted a 0.1-micrometer fine structures to be obtained and, in the near future, the diameter of silicon wafers will move from 8 to 12-inches. As for computer applications, so called multi-media applications (including motion pictures, music, voice, communications, etc.) are widely used in home and business environments, and these applications require large quantities of data as well as high processing performance. With these related semiconductor and computer industry requirements in mind, current research is directed to the integration of large capacity memory (e.g., a DRAM) and high performance logic blocks in a single chip. Since the DRAM is the most popular memory LSI for realizing a high degree of integration because it can hold a large amount of data, almost all such research is focused on the logic-integrated DRAM. This type of LSI device is particularly effective because it overcomes the well-known limitation on data transfer speed between memories and processors. For example, Y. Aimoto, T. Kimura and Y. Yabe et. al. developed the Parallel Image Processing RAM (PIP-RAM), reported in the 1996 Digest Technical Papers of IEEE International Solid State Circuit Conference (ISSCC) SP-23.3 pages 372–373 476, and in the Slide Supplement 1996 to the Digest of Technical Papers ISSCC Vol. 39 pages 298–299 479, on a device which integrates 16-Mb DRAM and 128 processor elements in a chip by using a 64-Mb DRAM technology.

Generally speaking, almost all processing requirements in multi-media applications are simple, but the volume of such requirements is large. PIP-RAM was one solution for processing multi-media applications because it can execute 128 operations in parallel at 30-Mhz and each processor has an 8-b memory data bus. Thus, the data transfer speed between memory and processor is fast (128×8-b, 30-Mhz). Moreover, the necessary power dissipation is kept low since both a large capacity DRAM and a large quantity of processor elements are integrated on a single chip. A lower resistance and a lower capacitance in the memory-processor data/instruction bus were realized, when compared to a conventional multi-chip solution, by the use of logic integrated memory technology.

Notwithstanding these developments, a strong demand for even larger memory capacity and higher processing performance exists in multi-media. The recent progress in hardware (e.g. fabrication technologies, etc.) and in software (e.g. more intelligent, scaleable, network-oriented, etc.), has the potential to provide more memory capacity and higher processing ability for logic integrated memory LSIs. However, such advances require a larger number of input/output (I/O) bits for the memory and higher frequency/parallelism for the processors. Further, these techniques naturally increase power dissipation and the resulting LSI is more likely to malfunction. Both large power consumption and high speed operation cause a large peak current and make voltages bounce in the LSI. Also, high power dissipation in such LSIs requires the use of expensive packages (e.g., made of ceramic or metal, and even accompanied by a cooling fan on the package) and the resulting high-prices tend to limit LSI usage. Large power dissipation also limits usage in mobile applications because of the well-known battery power limitation. There also is a problem with voltage bounce on signal wiring, which tends to cause a malfunction.

The various feature of PIP-RAM, particularly the circuit techniques and it's operation will be described as background for the present invention.

Referring to FIG. 1, there is shown a chip microphotograph of a PIP-RAM, as reported in the aforementioned ISSCC articles. In FIG. 1, a 128-Kb DRAM element (DE) 101, comprising eight 16-Kb memory units (MU) 102. The chip also has a processor element (PE) 103, and a main-word decoder and internal power supply 104. An assembly of clock buffers and control circuits 105, a phase locked loop (PLL) 106 and redundant PE-DE pair 107 is provided. There are 128 DE-PE pairs integrated in a chip and this structure enable a 128 parallel SIMD operations. All DE-PE pairs execute the same operation lead by external instructions.

The block diagram is shown in FIG. 2, where a main-word decoder 201, main-word address 202, sub-word/column/MU addresses 203, serial data 204, and immediate data 205 can be seen. The same main-word address, subword/column/MU address and instructions are distributed to all PE-DE pairs. Instructions and an instruction bus are omitted from this figure to simplify the description. The zero and first level DRAM elements (DE-0, DE-1), 206, 208 and the zero and first-level processor element (PE-0, PE-1), 207, 209 through the 128th, DE and PE elements 221, 227 are shown, indicating that there are 128 DE-PE pairs involved in a chip. Reference numerals 210, 211, 212, 213, 214, 215, 216, 217, 218, 219, 220 represent main-word lines, sub-word lines, sub-word decoder, sub-word address, memory unit (MU) 0-7, data-line (DL) pair, column decoder, MU selector, data amplifier (DA), column address, and MU address, respectively. Three address, main word/column/MU addresses, are delivered to the MU via a selector 222. For some operations, the selector 222 selects sub-word/column/MU addresses issued by external devices and for others it selects addresses issued internally. In the latter case, an inter-PE transfer bus 227, address/data registers 224, selector 225 and ALU 226 generate an internal address. In the PIP-RAM, memory block MU and processor block PE are face to face, and connected to a 8-b data bus.

FIG. 3A shows the paged-segmentation scheme utilized in the PIP-RAM for high-speed memory access. Reference numerals 301, 302, 303, 304, 305, 306, 307, 308 shows main/sub-word address, MU address, sub-word decoder, sub-word line A, sub-word line B, sub-word line Z, page, and segment, respectively. FIG. 3B shows the timing chart representative of a memory access. All of the main/sub-word lines are implemented in the MUs, which means that all main/sub-word address are accessible in any of the eight Mus, that form the DE.

All conventional DRAM's have a word address and a column address. Some of them use both a main-word and a sub-word address as a word address. When the address change occurs only in the column address, the conventional DRAM access speed is fast. This is typically called a "page mode access". This same address scheme can be extended to a memory address composed of word, column and MU address. This approach can realize a fast random access to all 8 Mus if the address change only occurs in MU address, because every MU has a word/column address decoder and sense amplifiers. Sense amplifiers latch the data read from memory cells so the MU address change is almost the same as the column address change. A memory address which has the same main/sub-word address is called a "segment". When a page miss occurs in a memory access, this scheme can hold the fast memory access if a segment miss does not occur. This scheme expands the high-speed access area. By using this paged segmentation scheme, a fast DRAM access with larger accessible area can be realized.

FIG. 3B shows for three separate cases, (1) page hit, (2) page miss/signal hit and (3) signal miss, the condition of the system clock 310, column address 311, MU Address 312, Main Word Address or sub-word address 313, sub-word line A 314, sub word line B 315, sub-word line Z 316 and data out 317 during one or more cycles.

FIGS. 4A and 4B show the clocked low-voltage-swing differential-charge-transfer scheme that has been developed to reduce the power consumption of the PIP-RAM. Sub-word line 401, bit-line 402,/bit-line 403 (here the symbol "/" means complement), memory cell 404, transfer gate-1, 405, the clock for transfer gate-1 406, sense amplifier 407, the clock for sense amplifier 408, sense amplifier data line 409,/sense amplifier data line 410, transfer gate-2 411, and the clock for transfer gate-2 412, are shown in FIG. 4A. Similarly, data line 413,/data line 414, transfer gate-3 415, the clock for transfer gate-3 416, data line 417,/data line 418, data amplifier 419, and the clock for data amplifier 420 also are shown. Data lines 413, which transfer data between DRAM and PE, have a large capacity and high resistance. Consequently, data transfer through data lines is accompanied by long delays and large power consumption. To overcome this difficulty, transfer gates are disposed between the bit line 402 and sense amplifier 407 (TG1), the sense amplifier 407 and the data line 417 (TG2), and the data line 417 and the data amplifier 419 (TG3). Both open/close timing for the transfer gates are carefully controlled by individual clocks delivered by a phase-locked loop (PLL). The timing of signals during the operation of the arrangement in FIG. 4A can be seen in FIG. 4B. In particular, the signals on the Sub Word Line (SWL) Bit Line (BL, $\overline{BL}$), TG1 Control Clock (TG1 CLK), 5A Control Clock (5ACLK), Sense Amplifier Data (SAD, $\overline{SAD}$) TG2 Control Clock (TG2CLK), Data Line (DL, $\overline{DL}$), TG3 Control Clock (TG3CLK) and Data Amplifier Clock (DACLK) can be seen. This scheme reduces the logic voltage swing in the data lines and it results in a reduced driving current for the data lines. Data lines 417, 418 are driven in a differential mode so that noise margin is kept large. Since the PIP-RAM has 1024 (8×124) data lines, this scheme reduces the power consumption of the data lines down to about ⅓.

There is a competitive relation between high-speed access and a high-capacity data storage in memory LSI circuits. The number of memory cells for both bit-line and word-line may be reduced to achieve a high-speed operation, but such step also reduces the integration capacity of a device because peripheral circuits (e.g. address decoder, sense amplifier, pre-charge and equalize circuits, etc.) share a finite layout area. Larger layout areas are required for peripheral circuits if we divide the total number of memory cells into a large number of "mat", each of which contains a small number of memory cells. For example, a one-mat 16-Mb DRAM can be small but will be slow and an eight-mat 16-Mb DRAM will be fast, but the chips size is large. As is well known, the layout area of memory cells is defined by the process technology and total memory capacity, independent of chip architecture and circuit scheme. The total layout area of an LSI circuit, its so called "die size", is designed to be as small as possible in order to reduce chip production cost. To reduce the ratio of peripheral circuits to chip size in the same process technology, it is preferable to increase the number of memory cells for both bit-line and word-line directions. However, such increase will slow down operation speed.

The PIP-RAM employs new circuit techniques for low-power and high-speed operation. They are effective for both power reduction and high-performance realization, however, they also require a large number of peripheral circuits which occupy a large layout area. Accordingly, the memory cell occupation ratio is less than 8% of chip size. This value is almost six times smaller than the conventional DRAM LSI. This disadvantage limits the chip memory capacity to 16-Mb, even though the chip is made with a 64-Mb DRAM process technology.

Since the PIP-RAM was developed for multi-chip applications, it's limited memory capacity and processing ability was not a significant disadvantage for system applications. For example, a fingerprint recognition system could be made by using only one PIP-RAM LSI device and a controller chip. On the other hand, there are many hardware consuming applications (e.g. surveillance, autonomous land vehicle, document analysis, etc.) that involve multi-media and require the use of eight or more PIP-RAM LSI devices. Since the PIP-RAM adopts a single instruction multiple data stream (SIMD) architecture, all processor elements perform the same job at the same time. Accordingly, a SIMD approach is very powerful for multi-media applications because it combines simple processing with large capacity data storage, and it permits easy expansion from a single chip to a multi-chip architecture. However, for these heavy volume applications, it is difficult to design a system board because a heavy PIP-RAM usage results in a large peak current. As is well known, the most power consuming operation is "data write", and when the data write instruction is issued, all PEs and all PIP-RAMs execute such high-power consuming write operation at the same time, causing a large peak current. This problem limits the realization of cheap, multi-media systems because a multi-chip PIP-RAM board needs both a high-power battery (which can supply a large current) and large capacitors to stabilize the voltage bounce of supply lines. It is also necessary to use a large number of high-speed external data I/O lines and to achieve a high data transfer rate from/to external devices. Moreover, PIP-RAM has the disadvantage of a slow DRAM access speed (30 ns/cycle) for random data access. In fact, it can degrade the operation frequency down to as low as 15-Mhz when a segment miss occurs. This slow access speed limits the system performance for heavy applications. Indeed, the maximum operation frequency (30-Mhz) of the PIP RAM is defined by this slow memory access speed. Currently, the processor frequency reaches to 500-Mhz and one chip DRAM capacity reaches to 64-Mb. However, the DRAM access speed still remains about 30-Mhz. The speed difference between DRAM and processor is large, approximating one order of magnitude. This limit on speed is not easily overcome since the processor elements for the PIP-RAM do not have not have a pipeline architecture, as they are designed to have lower operation voltages for the processor element. Thus, while the PIP-RAM design is effective for power reduction, the performance of the PE is much poorer than that of conventional processors.

Multi-media applications need a high memory bus bandwidth (bus bandwidth is defined by memory access frequency×number of I/O bits). Almost all logic integrated memories have a high speed memory access and use a wide memory bus width to comply with this requirement. The most power consuming part in a memory LSI is the sense amplifier. As described above, high speed and wide data read/write from/to a memory LSI will cause a large current consumption because a large number of sense amplifiers become active at the same time. The existence of a large current for simultaneous wide data read/write causes a voltage bounce in the supply lines and may cause a malfunction. Thus, it is necessary to provide a large layout area for supply lines (because it reduces the resistance and increases the capacitance of the supply lines) in order to overcome this problem; but it leads to a larger chip size. As mentioned before, SIMD is effective for multi-media applications and it can provide the high performance required by heavy multi-media applications. The larger the memory bus bandwidth, the larger the amount of memory data read/write activity, resulting in larger current flows. One of the most effective ways to reduce power dissipation while achieving high frequency operation is to reduce the operation voltage, as previously described for the PE in the PIP-RAM. A reduction in the voltage swing in signal lines also is effective, as in the case of data lines in the PIP-RAM. Both, however, are apt to affect external/internal noise and, for LSI, may result in miss-operation. This is a serious problem for future logic integrated DRAM LSIs, which will have larger memory capacity and higher performance. As different systems have a different number of memories and processors, there has been no uniform way to reduce the delay time for word address change (including both main-word and sub-word addresses).

In summary, the conventional logic integrated memory LSIs with SIMD architecture do not have a way to avoid the large leakage current brought about by simultaneous data read/write operations. It has not been possible to reduce the delay time for word address change. There has been no way to achieve a low-power, high-speed, highly-reliable performance that corresponds to an increase in a memory capacity and a processing speed.

SUMMARY OF THE INVENTION

Accordingly, it is an object of the present invention to provide a circuit technique for low-power, high-speed and highly reliable SIMD-architecture logic integrated memory LSI's, and a controlling method therefor, which overcome the above mentioned drawbacks of the conventional design.

The above and other objects are achieved in accordance with the present invention by a logic integrated memory that comprises a plurality of memory blocks, a plurality of logic blocks, a plurality of data signal lines for outputting and receiving data between memory blocks and logic blocks, a plurality of blocks which control the memory and logic blocks, a plurality of clock generation blocks, a plurality of control signal lines for both memory and logic blocks, and a plurality of signal lines for outputting and inputting external signals.

The plurality of logic blocks are driven according to a single-instruction multiple-data protocol. Significantly, each memory block is driven at a different timing and each logic block is also driven at a different timing, the timing difference is 1/[M×f] for memory blocks and 1/[N×f] for logic blocks, where the number of memory blocks is M, the number of logic blocks is N, and f is the LSI operation frequency.

When the operation frequency for a memory block is $f_M$, the operation frequency for a logic block is $f_N$, the I/O number of memory blocks is m and the I/O number of logic blocks is n, these values satisfy the relation of, $$f_M \times m = f_N \times n.$$

Also, the order of issued addresses can change be shifted in order to minimize the number of word addresses changed, and the order can be restored to the original sequence after a memory access.

With the above mentioned arrangement, a high-speed, low-power and highly-stable logic integrated DRAM LSI with SIMD architecture can be realized.

BRIEF DESCRIPTION OF THE DRAWINGS

FIG. 6 shows an extension of the SIMD architecture logic integrated DRAM shown in FIG. 5C;

DESCRIPTION OF THE PREFERRED EMBODIMENTS

Figure 1:
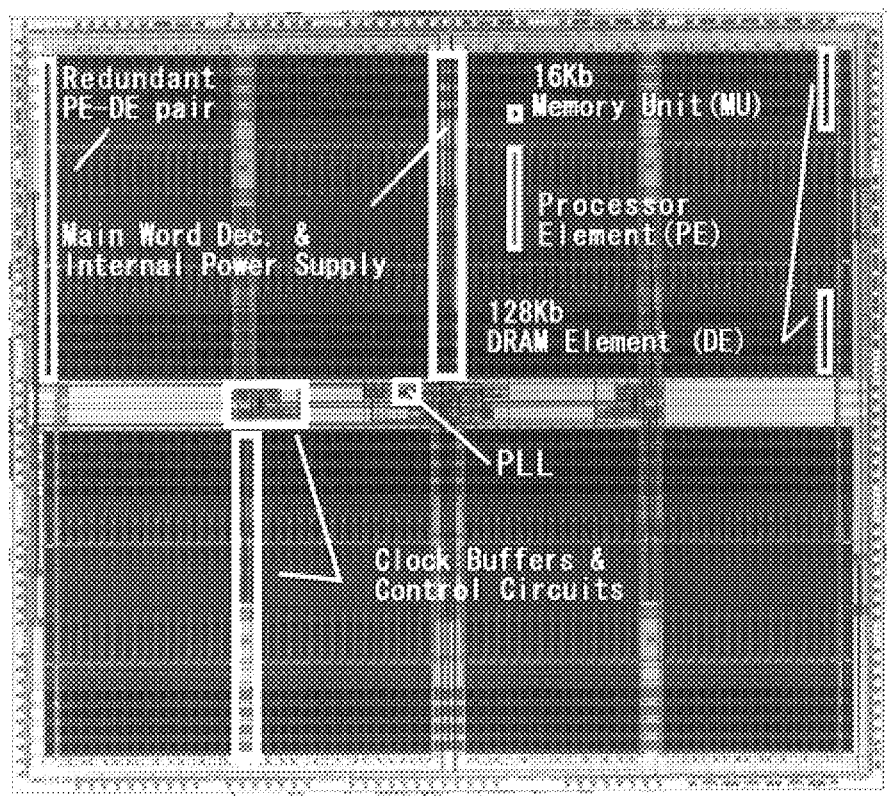
FIG. 1 is a chip microphotograph of a Parallel Image Processing RAM (PIP-RAM) constituted of DRAM blocks and logic circuit blocks, adopting a single instruction multiple data stream (SIMD) architecture.
Figure 2:
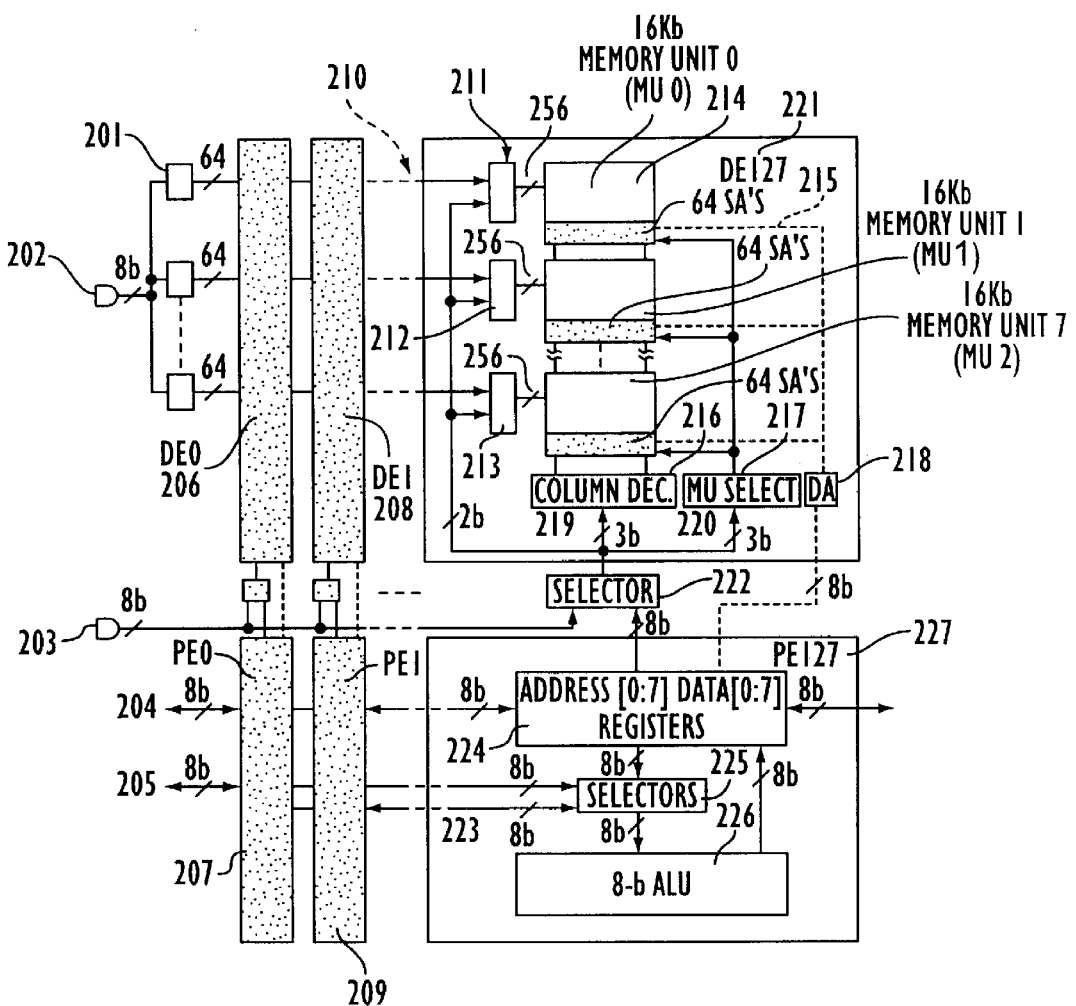
FIG. 2 illustrates a block diagram of the PIP-RAM.
Figure 3A:
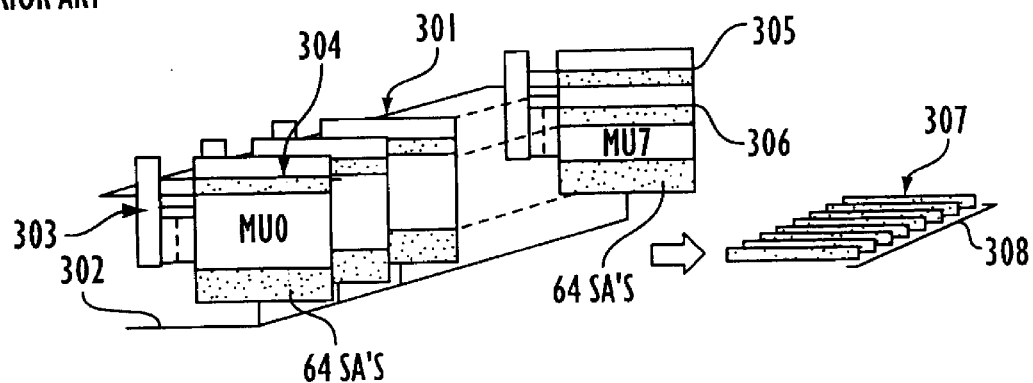
FIGS. 3A and 3B show the paged-segmentation scheme implemented in a PIP-RAM, for providing a high-speed and low-power memory access.
Figure 3B:
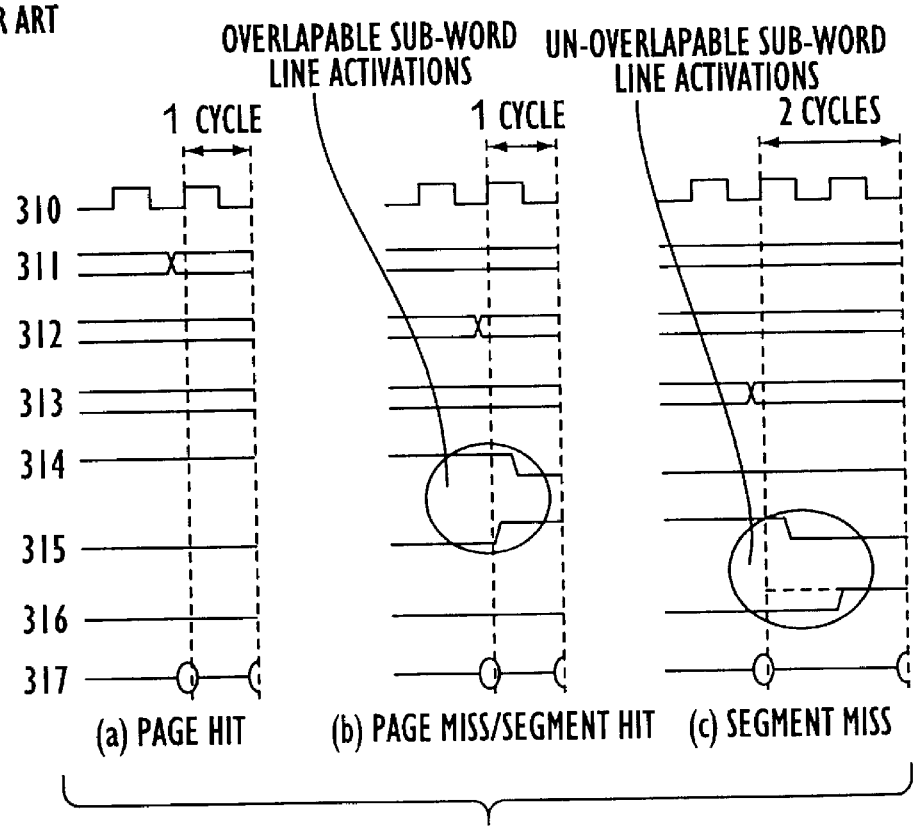
Figure 4A:
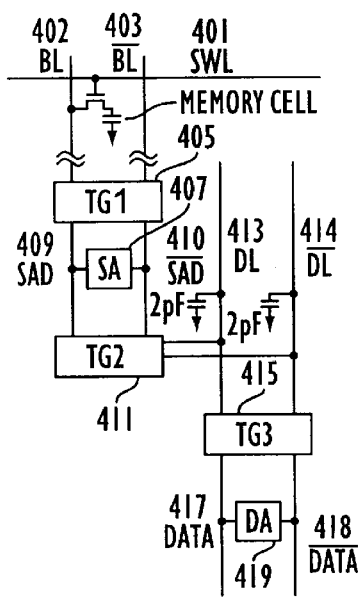
FIGS. 4A and 4B show the clocked low-voltage-swing differential-charge-transfer scheme of an PIP-RAM.
Figure 4B:
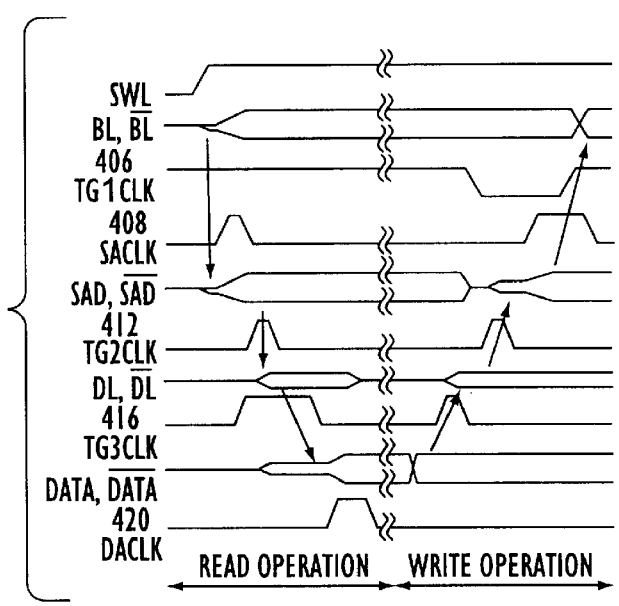
Figure 5A:
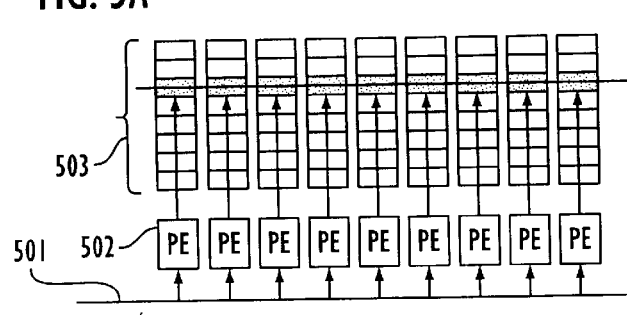
FIGS. 5A–5D show the block diagrams of a SIMD architecture logic integrated DRAM in conventional scheme (FIGS. 5A–5B) and present invention (FIGS. 5C and 5D)
Figure 5B:
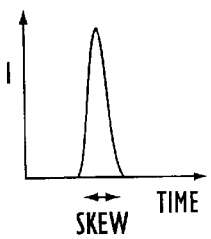
Figure 5C:
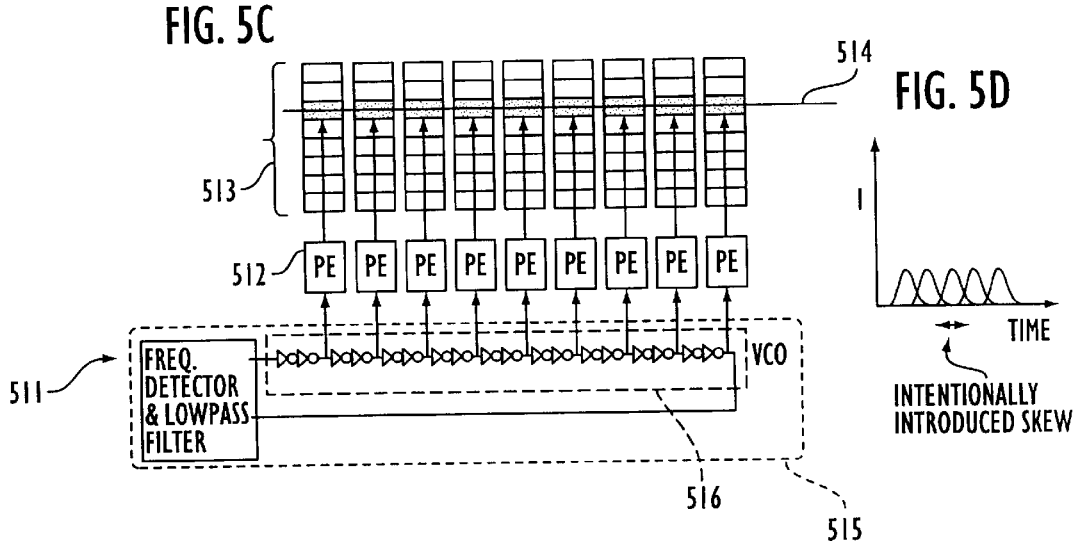
Figure 5D:
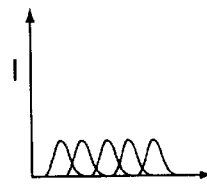

Referring to FIGS. 5A and 5C, there is shown a block diagram of a SIMD architecture logic integrated DRAM LSI. A conventional scheme is shown in FIG. 5A and the first embodiment of the present invention is shown in FIG. 5C.

In FIG. 5A, each logic block or processing element (PE) 502 will access registers or memories 503, and an access timing is defined by the clock signal 501. As seen in FIG. 5B, clock skews are on the order of 100-ps. In the conventional case, as shown in FIG. 5A, every PE 502 accesses to the same column of registers or memories 503. This is because all PEs execute the same instruction. To simplify the example, assume that all the register or memory addresses are issued directly to the register or memory blocks, and are not issued through logic blocks (PEs). The larger the number of registers or memory blocks, the larger the amount of peak current flow. A large peak current cause a voltage bounce in a power supply or a ground line 504 and cause LSI miss-operation.

In accordance with the present invention, as shown in FIG. 5C, each PE 512 will access the registers or memory blocks 513 with different timings controlled by a phase locked loop (PLL) 515. A clock 511 provides pulses to a frequency detection and low pass filter unit 517 within the PLL 515. The clock for each PE has a timing skew which is intentionally introduced by a voltage-controlled oscillator (VCO) 516 in the PLL 515. Therefore, each register or memory block is accessed with a different timing and the peak current is reduced. To simplify the description, a PLL circuit was shown, however, a delayed locked loop (DLL) circuit or synchronous mirror delay (SMD) circuit may be used to introduce an intentional clock skew between PEs. The optimum clock delay between PEs is 1/[f×N] [s], where f is the clock frequency for the PE; and N is the number of PE's.

Referring to FIG. 6, there is shown a block diagram of a second embodiment of the SIMD-architecture logic integrated DRAM LSI that comprises the present invention. This embodiment is an extension of the first embodiment to a various number of, and different frequency operation for, both memory and logic blocks. The illustrated embodiment has eight memory blocks 601 and four logic blocks 602, but this is only an example. Memory clocks 603, $\Phi_{m0}$, $\Phi_{m1}$, $\Phi_{m2}$, ... $\Phi_{m7}$, have a delay of $1/[8 \times f_M]$, $2/[8 \times f_M]$, $3/[8 \times f_M]$, ..., $8/[8 \times f_M]$, respectively. Here, $f_M$ is the clock frequency of the memory blocks. Logic clocks 604, $\Phi_{n0}$, $\Phi_{n1}$, ..., $\Phi_{n3}$, have a delay of $1/[4 \times f_N]$, $2/[4 \times f_N]$, ..., $4/[4 \times f_N]$, respectively. Here, $f_N$ is the clock frequency of the logic blocks. In this embodiment, $f_M$=30-Mhz and $f_N$=120-Mhz, for example. In a general case, the clock cycle for logic blocks can be faster than that of the memory blocks by using conventional semiconductor fabrication and circuit technologies. Setting the I/O bus between memory blocks (m-b I/O) and logic blocks to satisfy the relation of $$f_M \times m = f_N \times n,$$

one can realize a correct data transfer between memory and logic blocks. The example of FIG. 6 realizes this scheme by using memory register 605 and logic register 606.

Figure 7:
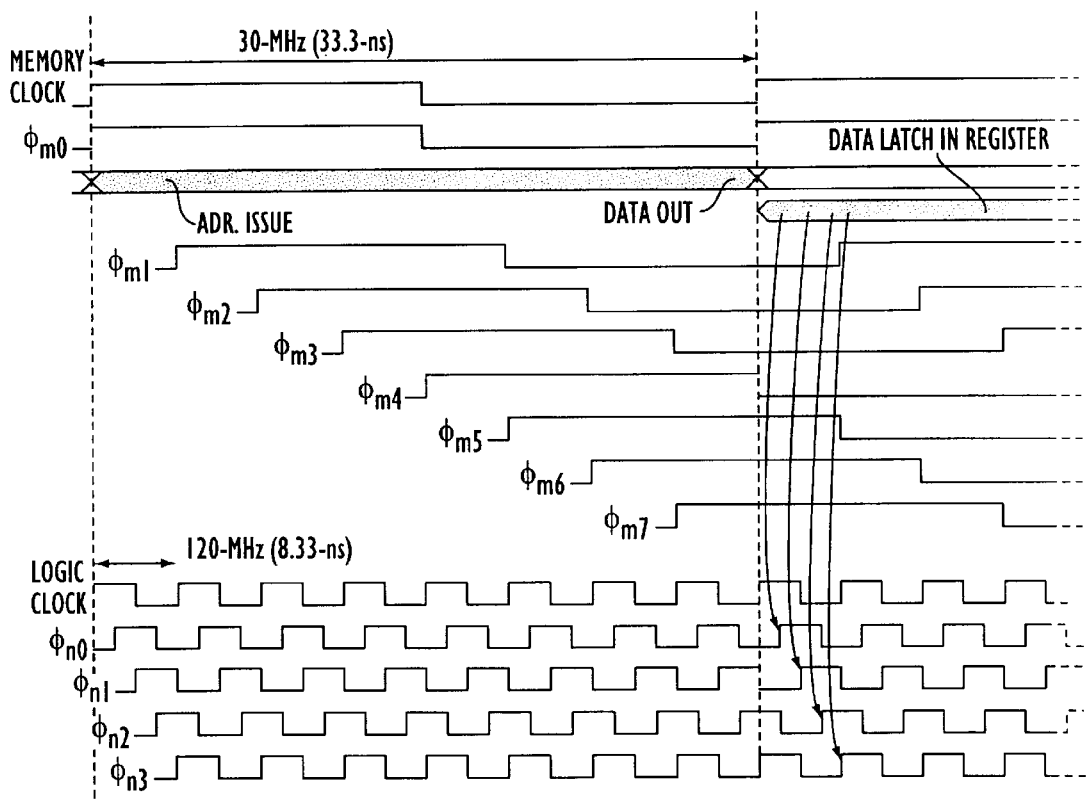
FIG. 7 shows a timing chart for a memory access with the block diagram shown in FIG. 6.
Figure 8:
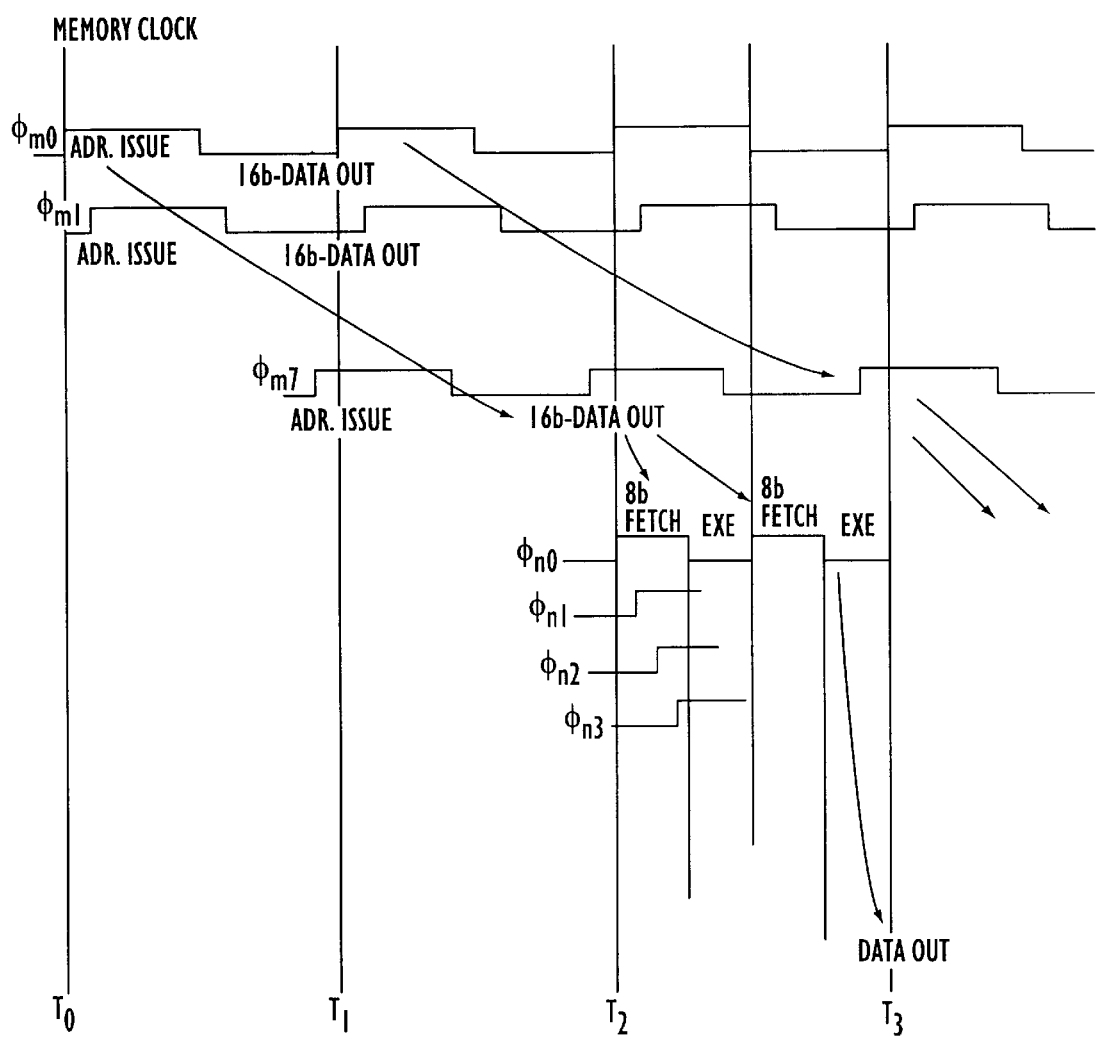
FIG. 8 also shows a timing chart for the block diagram shown in FIG. 6.

Referring to FIG. 7, there is a timing chart for the circuit shown in FIG. 6. For one memory cycle, after an address is issued, data from the memory blocks becomes usable for the logic blocks. As is clear from FIG. 7, all data from all memory blocks becomes usable only at two memory clocks after an address is issued because there are plural memory blocks and a delay between them. Data flow is, however, not interrupted by clock delay for each memory block and each logic block, as shown in FIG. 8. Then during time period $T_1$ of the memory clock, staggered phase clocking for each line results in an address being issued for each of $\Phi_{m0}$–$\Phi_{my}$, followed by a 16 Mb data readout of all lines within two clock cycles, i.e., by $T_2$. The data out for each line is similarly followed by staggered fetch and execute cycles $\Phi_{n0}$–$\Phi_{n7}$, the execute resulting in a readout of the data. Only the case of data read from memory blocks is shown in FIGS. 7 and 8, however, data write to memory blocks can processed in the same manner.

By using this scheme, a SIMD architecture logic integrated DRAM LSI, having a different number of blocks and different operation frequencies between memory blocks and logic blocks, can be realized. Thus, the I/O number of logic blocks can be reduced as well as the layout area of the logic blocks, leading to a minimized chip size and a reduced production cost. Consequently, a high-performance, high memory bus bandwidth, accompanied by stable operation, can be realized by using aforementioned embodiment.

Figure 9A:
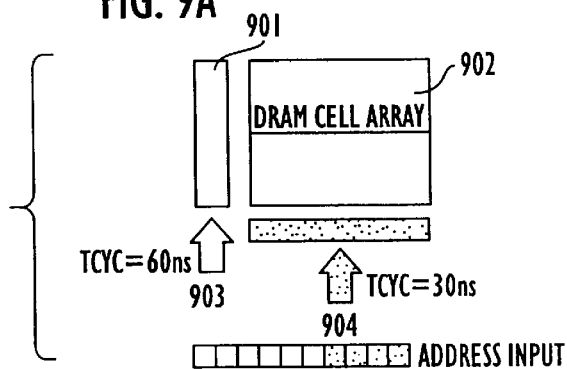
FIGS. 9A–9D show an address-out-of-order scheme.

FIG. 9A shows a diagram of a third embodiment of the SIMD architecture logic integrated DRAM LSI. In the figure, a DRAM cell array 902 is accessed by an address input comprising a word address portion and column address portion. The word addresses is applied by an address decoder 901 and the column addresses applied by a column address decoder 904. The word address is clocked at 60 ns while the column address is clocked at 30 ns. An access cycle with column address transition is fast (page mode) while the access cycle with word address transition is slow.

Figure 9B:
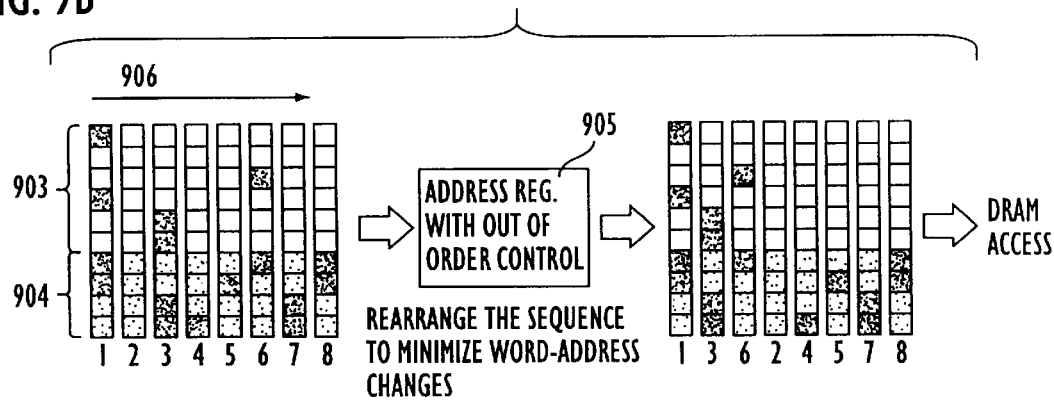
Figure 9C:
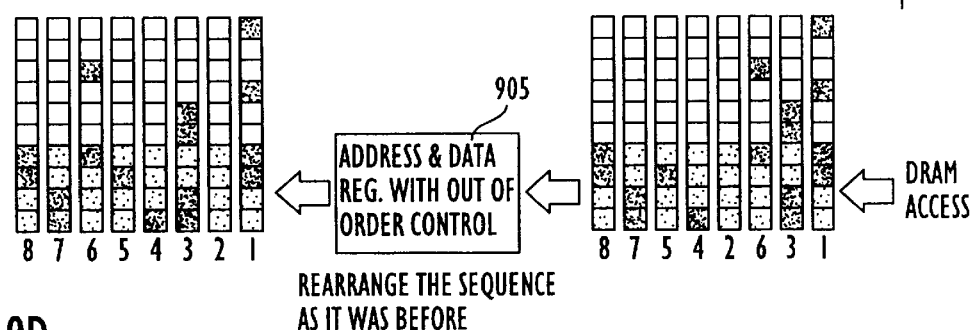
Figure 9D:
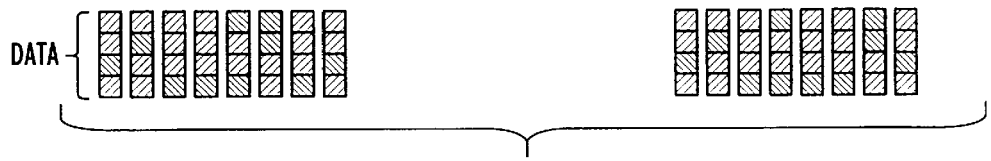

As described, the word line address change needs more time than the column address change in a DRAM access. Moreover, a word address change consumes more power because it activates a power consuming sense amplifier. Since a SIMD architecture is so simple, one can change the order of addresses for DRAM access by using an address register with out-of-order control 905, as seen in FIGS. 9B and 9C. As shown in FIG. 9A, an address register with out-of-order control 905 changes the sequence of issued address flow 906 to minimize the word address change. In the case shown in FIG. 9B, the original word address sequence in the direction of address flow is 1–8 and is reordered to 1, 3, 6, 2, 4, 5, 7, 8 in order to cluster the required changes (1,3, 6) and those involving no change (2, 4, 5, 7, 8). A similar reordering is used with a readout of the DRAM, as seen in FIG. 9C, which also shows the accompanying data. Using the foregoing technique, the number of address changes is reduced from five to four times. Clearly, the address register with out-of-order control capability can rearrange the data and instruction sequences to the original order after DRAM access as seen in FIG. 9C by using this scheme, and can realize a high-speed, low-power DRAM access.

As seen from the above, the logic integrated DRAM LSI with SIMD architecture in accordance with the present invention can avoid the problem of the prior art in which a large peak current flows and cause a circuit miss-operation, avoid the poor performance of logic blocks caused by a slow DRAM access speed, minimize the slow and power consuming word address change in a logic integrated DRAM LSI with SIMD architecture.

Therefore, high-speed, low-power and stable operation of logic integrated DRAM LSI with SIMD architecture can be realized.

The invention has thus been shown and described with reference to the specific embodiments. However, it should be noted that the present invention is in no way limited to the details of the illustrated structures but changes and modifications may be made within the scope of the appended claims.

What is claimed is:

1. A logic integrated DRAM LSI with SIMD architecture comprising:

a plurality of memory blocks, plurality of logic blocks, a plurality of data signal lines connected for transmitting and receiving data between associated ones of said memory blocks and said logic blocks, a plurality of control blocks operative to control said memory and logic blocks, a plurality of clock generation blocks, a plurality of control signal lines connected to said memory blocks and said logic blocks, a plurality of signal lines for outputting and inputting external signals, said plurality of logic blocks being driven according to a single-instruction-multiple-data-stream (SIMD) manner, said LSI further comprising;

means for driving each memory block at different timings and for driving each logic block at different timings, the timing difference comprising $1/[M \times f]$ for memory blocks and $1/[N \times f]$ for logic blocks, wherein the number of memory blocks is M, the number of logic block is N and the LSI operation frequency is f.

2. A logic integrated DRAM LSI with SIMD architecture in claim 1 wherein, when the operation frequency for memory blocks is $f_M$, the operation frequency for logic block is $f_N$, the I/O number of each memory block is m and the I/O number of each logic block is n, these values satisfy the following relation, $f_M \times m = f_N \times n.$ 3. A logic integrated DRAM LSI with SIMD architecture in claim 1 further comprising, means for changing the order in which addresses issue in order to minimize the number of word address changes required for access to said memory blocks and retrieval of data therefrom, and for restoring said retrieved data to the original address order after memory access.

4. A logic integrated DRAM (LSI) with SIMD architecture in claim 1 wherein said means for driving comprises a phase locked loop having a plurality of taps, each connected to a respective logic block.

5. A logic integrated DRAM LSI with SIMD architecture in claim 4 wherein said phase lock loop comprises a voltage controlled oscillator.

6. A logic integrated DRAM LSI with SIMD architecture in claim 1 wherein said means for driving comprises a delayed locked loop.

7. A logic integrated DRAM LSI with SIMD architecture in claim 1 wherein said means for driving comprises a synchronous mirror delay circuit.

8. A method of accessing a logic integrated DRAM LSI with SIMD architecture, said LSI comprising a plurality of memory blocks, each memory block having connected thereto a corresponding logic block that is responsive to a clock signal for effecting access to said memory block, comprising;

generating a clock signal for effecting access to said plurality of memory blocks by said logic blocks;

delaying said clock signal; and applying said delayed clock signal to said logic blocks at different timings.

9. The method of accessing a logic integrated DRAM LSI with SIMD architecture as set forth in claim 8 wherein said memory blocks and said logic blocks are driven at different timings and the timing difference comprising 1/[M×f] for memory blocks and 1/[N×f] for logic blocks, wherein the number of memory blocks is M, the number of logic block is N and the LSI operation frequency is f.

10. The method of accessing a logic integrated DRAM LSI with SIMD architecture as set forth in claim 8 wherein when the operation frequency for memory blocks is $f_M$, the operation frequency for logic block is $f_N$, the I/O number of each memory block is m and the I/O number of each logic block is n, these values satisfy the following relation, $f_M \times m = f_N \times n.$ 11. The method of accessing a logic integrated DRAM LSI with SIMD architecture as set forth in claim 8, further comprising changing the order in which addresses issue in order to minimize the number of word address changes required for access to said memory blanks and retrieval of data therefrom, and restoring said retrieved data to the original address order after memory access.

* * * * *